United States Patent [19]

Robinson et al.

[11] Patent Number: 5,412,254
[45] Date of Patent: May 2, 1995

[54] HIGH VOLTAGE PULSE GENERATOR

[75] Inventors: Trevor H. Robinson, Chelmsford; Christopher J. Hodge, Ingatestone, both of United Kingdom

[73] Assignee: GEC-Marconi Limited, Middlesex, United Kingdom

[21] Appl. No.: 997,307

[22] Filed: Dec. 23, 1992

[30] Foreign Application Priority Data

Dec. 24, 1991 [GB] United Kingdom ............... 9127333

[51] Int. Cl.6 .............................................. H03K 3/53
[52] U.S. Cl. .................... 307/106; 307/107; 307/108
[58] Field of Search ............... 307/106, 108, 107, 112, 307/17, 109, 419, 422, 314, 200.1; 328/65, 67; 361/327; 372/81, 84, 83, 87, 58; 333/20, 24.2, 206; 343/712–713, 741, 788; 455/19, 41, 82, 99, 269–280

[56] References Cited

U.S. PATENT DOCUMENTS 4,189,650  2/1980  Aaland .......................... 307/108

Primary Examiner—Steven L. Stephan
Assistant Examiner—Aditya Krishnan
Attorney, Agent, or Firm—Spencer, Frank & Schneider

[57] ABSTRACT

A high voltage pulse generator for providing a high voltage pulse across a dielectric switch comprises a main high voltage pulse generator, an energy storing pulse forming line connected at one end to the main pulse generator and connected at the other end to an electrode of the dielectric switch, a high voltage trigger pulse generator and a ferrite loaded shock line. The ferrite loaded shock line, preferably located within the pulse forming line (or within a line on the output side of the switch), is connected at one end to the trigger pulse generator via a coaxial inner conductor and connected at the other end to a trigger electrode located within the dielectric switch. The pulse forming line enables a high voltage pulse to build up on the electrode of the dielectric switch, the trigger pulse having its edges sharpened by the shock line and triggering a discharge across a dielectric to an output line. This produces an extremely fast, high voltage pulse, e.g., for radar transmitter.

14 Claims, 2 Drawing Sheets

5,412,254

HIGH VOLTAGE PULSE GENERATOR

BACKGROUND OF THE INVENTION

The invention relates to an electrical arrangement, and more particularly to such an arrangement for applying a high voltage pulse across a dielectric switch.

Such arrangements can be used in pulsed radar transmission systems for example.

It can be important to ensure that the pulse is applied across the switch at a predetermined time, i.e. there is little jitter or statistical uncertainty in the timing of the pulse. This is even more important when several such arrangements are connected in parallel and where the output pulses are to be combined to produce a pulse of exceptional peak power.

BRIEF SUMMARY OF THE INVENTION

The invention provides an electrical arrangement, for providing a high voltage pulse across a dielectric switch, comprising means for generating a main high voltage pulse, an energy storing pulse forming line connected at one end to the main pulse generating means and connected at the other end to an electrode of the dielectric switch, means for generating a high voltage trigger pulse, a ferrite loaded shock line connected at one end to the trigger pulse generating means and connected at the other end to a trigger electrode located within the dielectric switch.

In use, the pulse forming line behaves like a transmission line and stores energy rising to a voltage corresponding to, say, 90% of the breakdown voltage of the dielectric switch. When sufficient energy has been stored within the pulse forming line, the trigger pulse generating means supplies a trigger pulse through the ferrite loaded shock line to the trigger electrode.

Ferrite loaded shock lines have a property that, if their characteristics are selected appropriately, they propagate relatively high voltage signals more rapidly than relatively lower voltage signals. Accordingly, a pulse having a certain rise time can be sharpened by an appreciable amount, the higher voltage part of the signal, in effect, "catching up" with the lower voltage part of the signal upon passage through the shock line. Therefore, when the trigger pulse reaches the trigger electrode, the trigger pulse initiates electrical breakdown of the dielectric switch, which causes the pulse forming line to discharge through a length of appropriate transmission line into a load such as an antenna. The fast rise time of the trigger pulse will ensure that the statistical uncertainty in the timing of the pulse, so called jitter, is minimised.

If the separate trigger electrode, shock line, and corresponding trigger pulse generator were not provided, then the arrangement could still, of course, be made to work, but there would be greater uncertainty as to when breakdown would occur.

In a preferred embodiment, the arrangement comprises a charging transformer for generating a high voltage level for the main pulse, the trigger generator means being connected to the ferrite loaded shock line by means of a length of coaxial cable wound as a secondary winding of the transformer. Alternatively, the trigger generator may be connected to the ferrite loaded shock line by means of a choke, the choke or the windings functioning in each case as an inductance to prevent the high voltage charge from leaking away.

Preferably a resetting supply is connected by a further length of coaxial cable to a coil wound about the ferrite loaded shock line, the further coaxial cable being wound as a secondary winding of the transformer.

The resetting supply and the coil are operative, after a pulse has passed along the shock line, to generate a magnetic field to remove the magnetisation generated by the passage of the pulse.

The pulse forming line may include a tubular conductor line, and the ferrite loaded shock line may be located within the conductor line. In such a case, it is preferred that the outermost conductors of the coaxial cables are each connected to the conductor line. Also preferably, the trigger electrode is located in spaced relation from an electrode connected to the conductor line.

As described above, the ferrite loaded shock line is located within the pulse forming line on the input side of the dielectric switch. In an alternative construction the ferrite loaded shock line may be located on the output side of the dielectric switch.

In a preferred arrangement, a plurality of energy storing pulse forming lines are each connected to a respective electrode of one of a plurality of dielectric switches, each switch including a trigger electrode connected by means of a ferrite loaded shock line to a common trigger pulse generating means.

The common trigger pulse generating means ensures that the same trigger pulse can be supplied to each trigger electrode simultaneously. Also preferably a common resetting supply is connected to each of a plurality of coils each wound about a respective one of the ferrite loaded shock lines.

BRIEF DESCRIPTION OF THE DRAWINGS

In order that the invention may be well understood, an embodiment thereof will now be described by way of example, with reference to the accompanying diagrammatic drawings, in which.

DETAILED DESCRIPTION OF THE PREFERRED EMBODIMENTS

Figure 1:
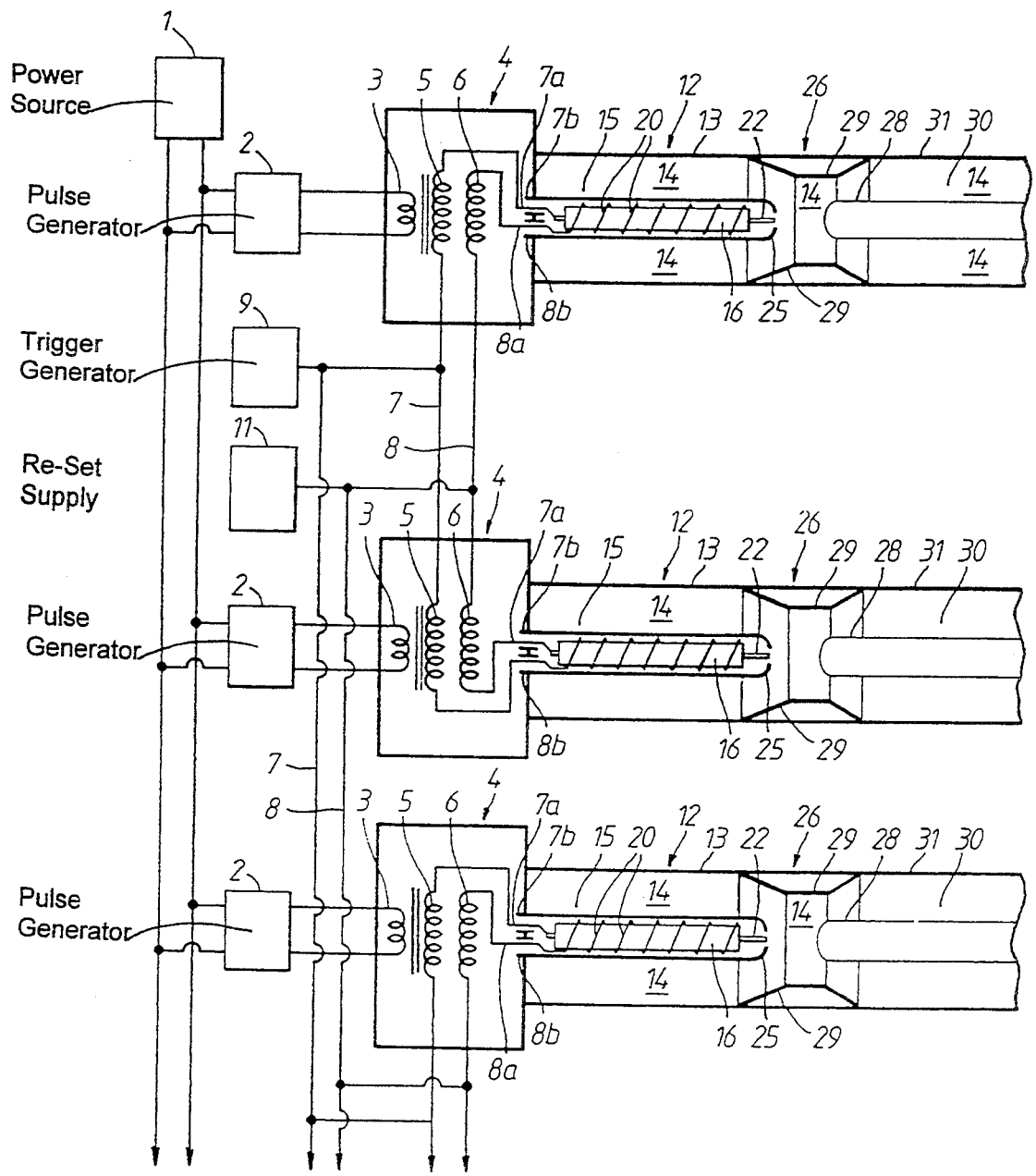
FIG. 1 is a schematic block diagram of an arrangement according to the invention.

Referring to FIG. 1, an electrical arrangement comprises a power source 1 connected to each of a plurality, three as shown, of pulse generators 2. The pulse generators 2 are each operative to provide pulses along the primary winding 3 of a transformer arrangement 4. The transformer arrangement 4 includes two secondary windings 5, 6, each wound from a length of coaxial cable 7, 8 respectively. A trigger generator 9 is operative to apply a trigger pulse through the innermost conductor 7a of the length of coaxial cable 7. The trigger generator 9 may comprise, for example, high voltage thyratron switches operated in parallel. A re-setting supply 11 is connected to the innermost conductor 8a of the length of coaxial cable 8.

Figure 2:
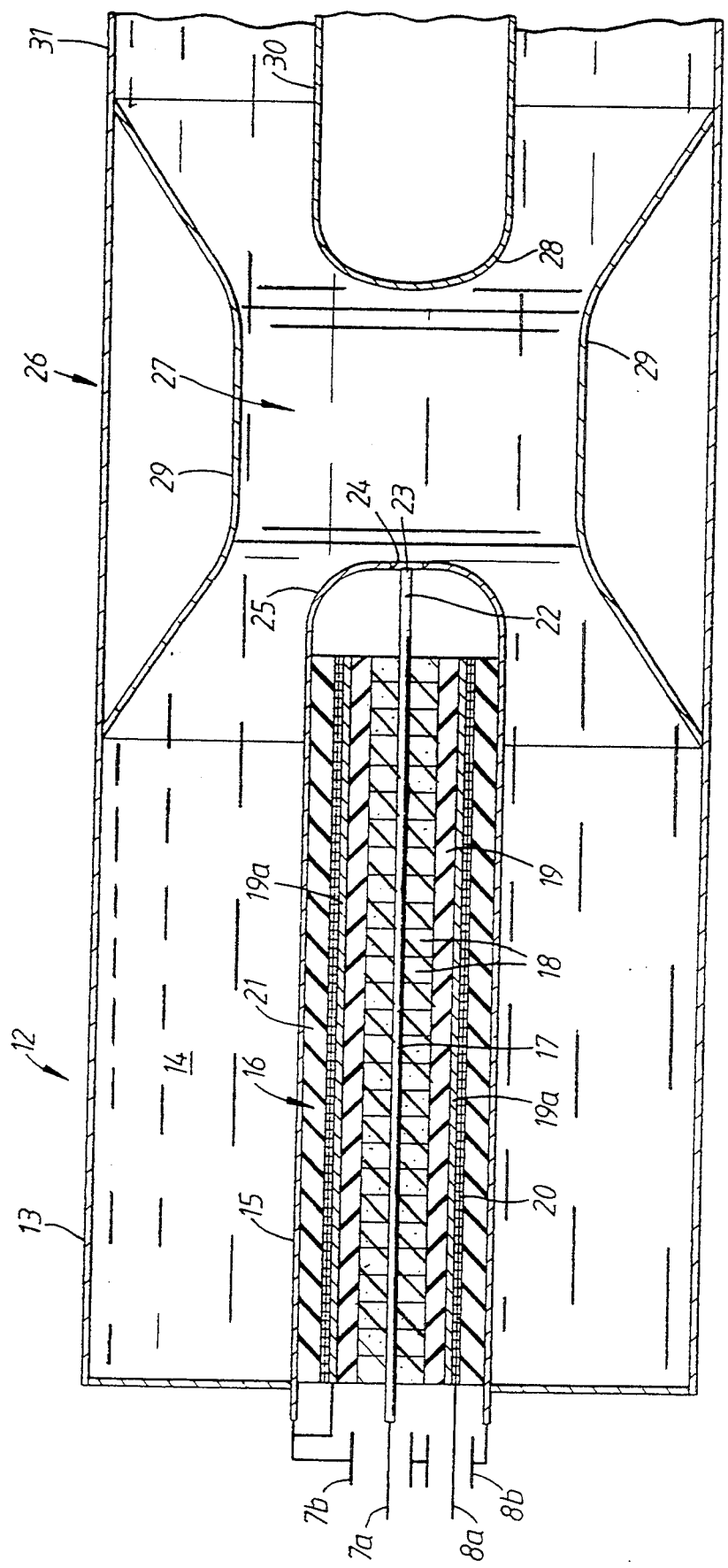
FIG. 2 is a longitudinal sectional, partly schematic, view to an enlarged scale of the pulse forming line shown in FIG. 1.

A pulse forming line 12, best seen in FIG. 2, comprises a container 13 preferably held at a level close to ground and filled with a dielectric medium 14 such as water or other liquids, preferably an oil. A tubular, generally cylindrical inner conductor 15 is located within the container 13 and is connected to the outermost conductors 7b, 8b of the coaxial cables 7, 8 leading from the secondary transformer windings 5, 6 respectively. As shown, the diameter of the conductor 15 relative to the container 13 has been exaggerated for clarity, and a practical embodiment would usually be much longer.

A ferrite loaded shock line 16 is located coaxially within the cylindrical inner conductor 15 and comprises an innermost rod 17 upon which are mounted a plurality of ferrite toroids 18 surrounded by an electrically insulating sleeve 19 and a conducting sleeve 19a. A coil 20 surrounds the conducting sleeve 19a and is electrically connected to the innermost conductor 8a of the length of coaxial cable 8. Further electrical insulation 21 is present between the coil 20 and the conductor 15. The central rod 17 is connected at its adjacent end to the innermost conductor 7a of the length of coaxial cable 7. The remote end of the rod 17 defines a trigger electrode 22, the tip 23 of which, as shown, is located within, and spaced from the walls of, a hole 24 within a generally main switch electrode 25, similar to a spark gap. The trigger arrangement shown is schematic and many alternatives exist, as will be apparent to those skilled in the art.

A dielectric switch cell 26 comprises a cavity 27 filled with a dielectric medium. The switch cell 26 may be connected to a load, such as an antenna (not shown), by means of a transmission line 30 separated by dielectric medium 14 from a substantially grounded outermost container 31. The conductor 30 includes a further switch, or load electrode 28 within the switch cell 26. The switch cell 26, as shown, includes intrusions 29 which are shaped to maximise the impedance match between the pulse forming line 12 and the load.

In use, the power source 1 and pulse generators 2 are operative to supply a pulse, e.g. in excess of 10 kV and carrying a current, say, in excess of 1 kA to the primary winding 3 of each respective transformer 4. Each transformer 4 steps up its respective pulse to a level in excess of 100 kV and which charges up and is stored within the pulse forming line. In the meantime, the trigger generator relays a trigger pulse in excess of, say, 10 kV to the innermost conductor 7a of the coaxial cable 7 and thus simultaneously through the windings 5 to the adjacent end of each ferrite loaded shock line 16. The rising edge of the trigger pulse is sharpened considerably during passage through the shock line, from, e.g., an order of nanoseconds to picoseconds. As soon as the trigger pulse reaches the trigger electrode 22, it initiates discharge between the switch electrodes 25 and 28 and from there the pulse passes to the load. With the parallel arrangement shown and because of the low relative jitter due to the common trigger source and the fast rise time of the trigger voltage produced by the ferrite loaded shock lines, the combined power from all the pulses can be considerable.

After the main pulse has discharged, the resetting supply is operative together with the coil to remove the magnetisation generated by passage of the pulse.

In an alternative construction the ferrite loaded shock line 16 could be located on the output side within the conductor 30, and the trigger generator arranged to supply a trigger pulse to a trigger electrode located adjacent the switch electrode 28. Instead of being supplied through the secondary windings 5 of the transformer 4, the trigger pulse, and the resetting pulse, could be supplied through a separate choke. The trigger arrangement could vary considerably to that shown. For example the trigger pulse may have the same or opposite polarity to that of the main pulse.

We claim:

1. A high voltage pulse generator for providing a high voltage pulse across a dielectric switch, the dielectric switch having a main switch electrode and a trigger electrode, the pulse generator comprising:
   means for generating a main high voltage pulse,
   an energy storing pulse forming line having a first end and a second end, the first end of the pulse forming line being connected to the means for generating a main high voltage pulse and the second end of the pulse forming line being connected to the main switch electrode of the dielectric switch,
   means for generating a high voltage trigger pulse, and
   a ferrite loaded shock line having a first end and a second end, the first end of the ferrite loaded shock line being connected to the means for generating the high voltage trigger pulse and the second end of the ferrite loaded shock line being connected to the trigger electrode of the dielectric switch.

2. A high voltage pulse generator according to claim 1, wherein the means for generating a main high voltage pulse comprises a charging transformer coupled to a means for generating a high voltage signal for the main high voltage pulse, and the means for generating a high voltage trigger pulse is connected to the ferrite loaded shock line by a length of coaxial cable wound as a secondary winding of the charging transformer.

3. A high voltage pulse generator according to claim 2, further comprising a re-setting supply connected by a further length of coaxial cable to a coil wound about the ferrite loaded shock line, the further coaxial cable being wound as a secondary winding of the charging transformer.

4. A high voltage pulse generator according to claim 1, in which the pulse forming line includes a tubular conductor line, the ferrite loaded shock line being located within the tubular conductor line.

5. A high voltage pulse generator according to claim 4, further comprising a first coaxial cable connecting the means for generating the main high voltage pulse to the pulse forming line and a second coaxial cable connecting the means for generating the high voltage trigger pulse to the ferrite loaded shock line, the first and second coaxial cables each having an outermost conductor and an innermost conductor, the outermost conductor of the first and second coaxial cables each being connected to the tubular conductor line.

6. A high voltage pulse generator according to claim 1, in which the trigger electrode is located in spaced relation, as in a spark-gap, from the main switch electrode of the shock line.

7. A high voltage pulse generator according to claim 1, in which the dielectric switch includes an input side coupled to the means for generating the high voltage pulse to the and an output side coupled to a load, the ferrite loaded shock line being located on the output side of the dielectric switch.

8. A high voltage pulse generator according to claim 1 for providing a high voltage pulse across each of a plurality of dielectric switches, each dielectric switch including a main switch electrode and a trigger electrode, the high voltage pulse generator comprising:
   a plurality of energy storing pulse forming lines, each energy storing pulse forming line being connected to the main switch electrode of a respective dielectric switch of a plurality of dielectric switches, and
   a plurality of ferrite loaded shock lines, each ferrite loaded shock line being connected to the trigger electrode of a respective dielectric switch and to the means for generating the high voltage trigger.

9. A high voltage pulse generator according to claim 8, comprising a plurality of coils, each coil of the plurality of coils being wound about a respective one of the plurality of ferrite loaded shock lines, and a resetting supply connected to each coil of the plurality of coils.

10. A high voltage pulse generator comprising:
   a pulse generator for generating a main high voltage pulse;
   a trigger generator for generating a high voltage trigger pulse;
   a pulse forming line having a cylindrical inner conductor having a first end and a main switch electrode, the pulse forming line being located within a container oriented along a longitudinal axis of the pulse forming line;
   a ferrite loaded shock line located coaxially with the longitudinal axis of the pulse forming line within the cylindrical inner conductor, the ferrite loaded shock line including,
      an innermost rod having a first end coupled to receive the main high voltage pulse and the high voltage trigger pulse, and a second end disposed in a spaced apart relation from the main switch electrode,
      a plurality of ferrite toroids mounted on the innermost rod along the longitudinal axis of the pulse forming line,
      an electrically insulating sleeve surrounding the plurality of ferrite toroids, and
      a conducting sleeve surrounding the electrically insulating sleeve;
   a dielectric medium formed between the pulse forming line and the container; and
   a dielectric switch cell coupled to the pulse forming line at the main switch electrode and to a load at a load electrode, the dielectric switch cell having a cavity filled with the dielectric medium formed between the main switch electrode and the load electrode, and an intrusion formed in the cavity which is shaped for maximizing an impedance match between the pulse forming line and the load.

11. A high voltage pulse generator according to claim 10, further comprising a charging transformer connected between the pulse generator and the pulse forming line.

12. A high voltage pulse generator according to claim 11, further comprising a main coaxial cable connected between the charging transformer and the pulse forming line for coupling the main high voltage pulse to the pulse forming line, the first coaxial cable having an inner conductor connected to the innermost rod and an outer conductor connected to the cylindrical inner conductor of the pulse forming rod.

13. A high voltage pulse generator according to claim 12, further comprising:
   a coil surrounding the conducting sleeve of the ferrite loaded shock line; and
   a resetting supply, coupled to the coil, for generating a resetting signal.

14. A high voltage pulse generator according to claim 13, further comprising a second coaxial cable coupled between the resetting supply and the coil for coupling the resetting signal to the coil, the second coaxial cable having an inner conductor connected to the coil and an outer conductor connected to the cylindrical inner conductor of the pulse forming line.

* * * * *